US006422878B1

(12) United States Patent
Pape et al.

(10) Patent No.: US 6,422,878 B1
(45) Date of Patent: Jul. 23, 2002

(54) PLUG-TYPE CONNECTOR AND METHOD OF MANUFACTURING A PLUG-TYPE CONNECTOR

(75) Inventors: Günter Pape, Enger; Dieter Lüttermann, Lübbecke, both of (DE)

(73) Assignee: Harting KGaA (DE)

( * ) Notice: Subject to any disclaimer, the term of this patent is extended or adjusted under 35 U.S.C. 154(b) by 0 days.

(21) Appl. No.: 09/783,638

(22) Filed: Feb. 14, 2001

(30) Foreign Application Priority Data

Feb. 26, 2000 (DE) .......................................... 100 09 215

(51) Int. Cl.[7] .................................................. H05K 1/00
(52) U.S. Cl. ............................................ 439/78; 439/83
(58) Field of Search ............................ 439/78, 83, 876, 439/877, 878, 884, 637, 79, 80

(56) References Cited

U.S. PATENT DOCUMENTS 3,960,430 A * 6/1976 Bunnell et al. ............. 439/422
5,535,513 A * 7/1996 Frantz ......................... 29/882
5,730,608 A * 3/1998 Legrady ...................... 439/78

* cited by examiner

*Primary Examiner*—Brian Sircus
*Assistant Examiner*—Chandrika Prasad
(74) *Attorney, Agent, or Firm*—Cook,Alex,McFarron,Manzo,Cummings & Mehler, Ltd.

(57) ABSTRACT

For the manufacture of a plug-type connector for surface-mounting on circuit boards, it is proposed that the required contact elements be provided with a constricted portion in a region between the plug-in contact end and the soldering-connection end, and that the contact elements introduced into the insulating casing of the plug-type connector be bent over, at the soldering-connection ends in the region of the constricted portion, by a first angle with the aid of a first tool, and be then bent further to almost 90° with the aid of a second tool, all the soldering-connection ends being aligned in a coplanar manner.

2 Claims, 5 Drawing Sheets

PLUG-TYPE CONNECTOR AND METHOD OF MANUFACTURING A PLUG-TYPE CONNECTOR

BACKGROUND OF THE INVENTION

The invention relates to a plug-type connector with contact elements which are disposed in an insulating body and are provided with a plug-in contact end and a soldering-connection end, the said soldering-connection end being constructed for surface mounting on a circuit board, and the said invention also relates to a method of manufacturing a plug-type connector.

For the purpose of improving the transmission properties in the case of high-frequency signals, plug-type connectors are provided with contacts which are suitable for surface mounting, satisfactory coplanarity of the contacts with respect to the soldering points on the circuit board being necessary.

From EP 0 846 350, a method of manufacturing a connector with coplanar contact faces for surface mounting on a circuit board is known, in which contact elements which have already been bent beforehand are inserted in contact-receiving slots in a casing and, after insertion, all the contact elements are aligned together in a coplanar manner by a tool.

Also known, from EP 0 757 849, is an electrical connector whose electrical contact sections, which are disposed in an insulating casing, have outwardly protruding soldering ends-whose formed-on surface-mounting contact faces, on narrow constricted portions which are provided for the purpose, are aligned in a coplanar manner by means of a tool after the mounting of the individual contact sections has been completed.

In the known methods of manufacturing plug-type connectors, relatively expensive procedures and a number of working steps are always necessary in order to align the soldering connections of a plug-type connector in a coplanar manner for surface mounting, for example by angling the contacts singly by means of a deflecting tool, and then, again individually, fitting them into a casing and aligning them.

In the course of equipping a circuit board with plug-type connectors which can be surface-mounted, the soldering-connection ends are usually dipped into a soldering paste and then soldered to the soldering faces on the circuit board under the action of heat. In order to ensure perfect soldering, the soldering-connection ends must touch the soldering paste, for which purpose, however, coplanar alignment of the soldering-connection ends in relation to the soldering faces on the circuit board is necessary.

SUMMARY OF THE INVENTION

The underlying object of the invention is to construct a plug-type connector of the initially mentioned kind to the effect that the soldering-connection ends have satisfactory coplanarity and the plug-type connector can be manufactured in a simple and cost-effective manner.

This object is achieved through the fact that the contact elements have, between the plug-in contact end and the soldering-connection end, opposed clearances forming a constricted portion, and that the contact elements are deflected, in the region of the said clearances, via a side which is not provided with a clearance.

An advantageous method of manufacturing a plug-type connector of this kind is indicated in claim 2.

The advantages obtained with the aid of the invention consist in the fact that, because of the constricted portion in a designated region of the contact element, the bending stress is compressed in the region of smallest cross-section so that, in the course of a deflecting operation, the contact element is bent over solely in this constricted region, even without a special deflecting edge.

What is of particular advantage in the proposed method of manufacturing a plug-type connector is that a number of working operations are dispensed with, the contact elements which are connected together on a contact-carrier strip being introduced directly into corresponding receiving apertures in the insulating body of a plug-type connector, and fixed therein. The contact-carrier strip is then removed and, in a next working operation, the soldering-connection ends of the contact elements are bent over and aligned in a coplanar manner.

BRIEF DESCRIPTION OF THE DRAWINGS

An exemplified embodiment of the invention is represented in the drawings and will be explained in greater detail below. In the said drawings.

DETAILED DESCRIPTION OF THE INVENTION

Figure 1:
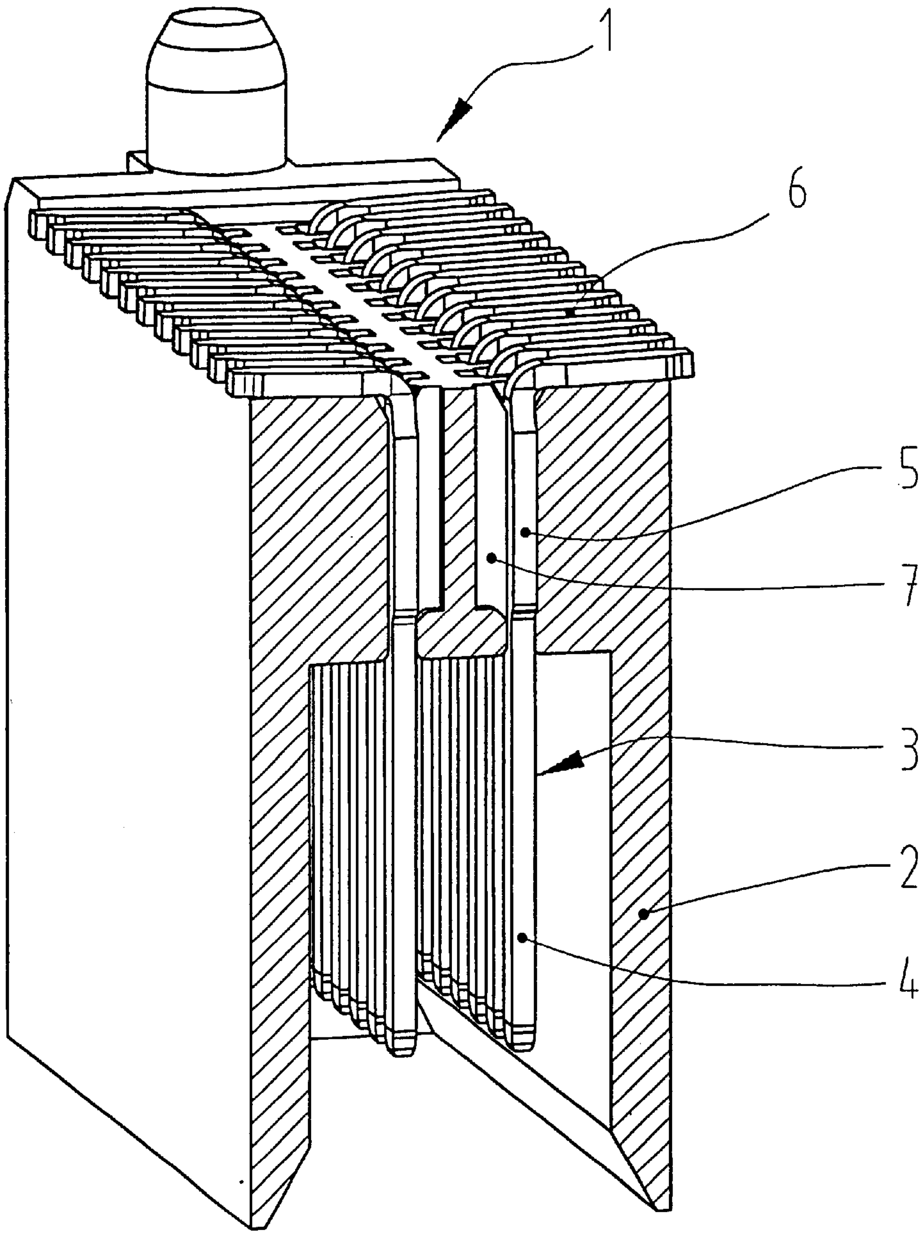
FIG. 1 shows a sectional representation, in perspective, of a plug-type connector with angled soldering-connection ends.

A plug-type connector 1 consisting of an insulating body 2 with a number of contact elements 3 is represented in FIG. 1. The contact elements 3 have a plug-in contact end 4, a fixing region 5 and a soldering-connection end 6, the said contact elements being fixed, by means of the fixing region 5 which is of broadened design, in correspondingly adapted receiving apertures 7 in the base region of the insulating body 2.

Figure 2:
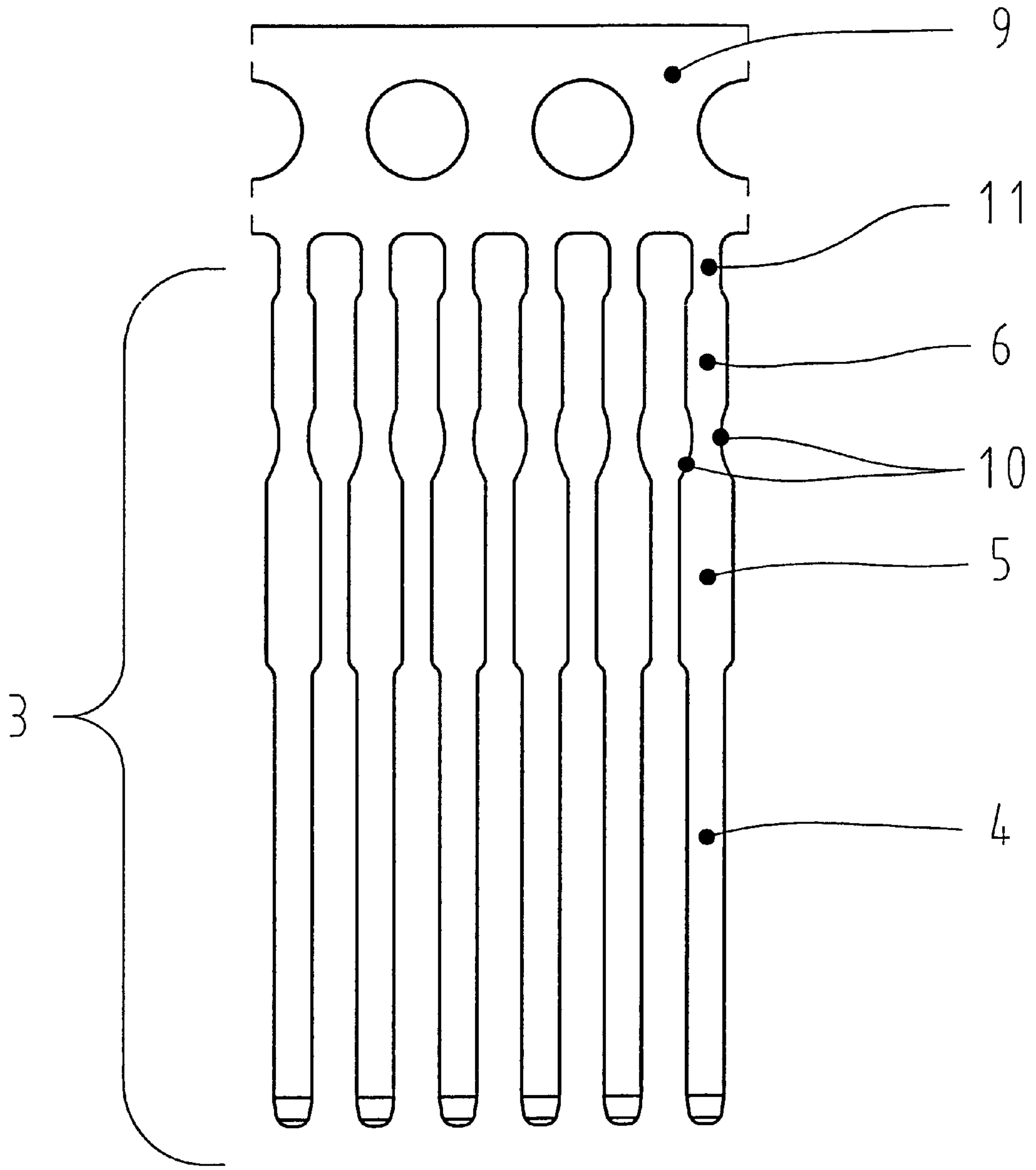
FIG. 2 shows a top view of a contact-carrier strip with contact elements.

FIG. 2 shows a top view of a contact-!carrier strip 9 with the formed-on contact elements 3 which have geometrical structures which differ in shape over their contact length as a whole. Contact-carrier strips of this kind, which are rolled up on a winding spool, serve for continuous feeding-in of the contact elements during the production of plug-type connectors, the structures of the said contact elements being stamped out of flat metal strips in a preceding working operation. In a certain section of the contact elements 3, which have preferably been stamped out with a rectangular cross-section, there are provided, between the fixing region 5 of broadened design (broadened compared with the rest of the breadth of the contact element) and the soldering-connection end 6, concave clearances 10 which are opposed on two sides and in which the material has been compressed, on either side of the outer enveloping boundary of the contact-element structure, to form an inwardly pointing constricted portion. A severing region 11, within which the contact-carrier strip 9 is separated from the contacts after the fixing of the contact elements 3 in the insulating casing 2, is provided above the soldering-connection ends 6.

Figure 3:
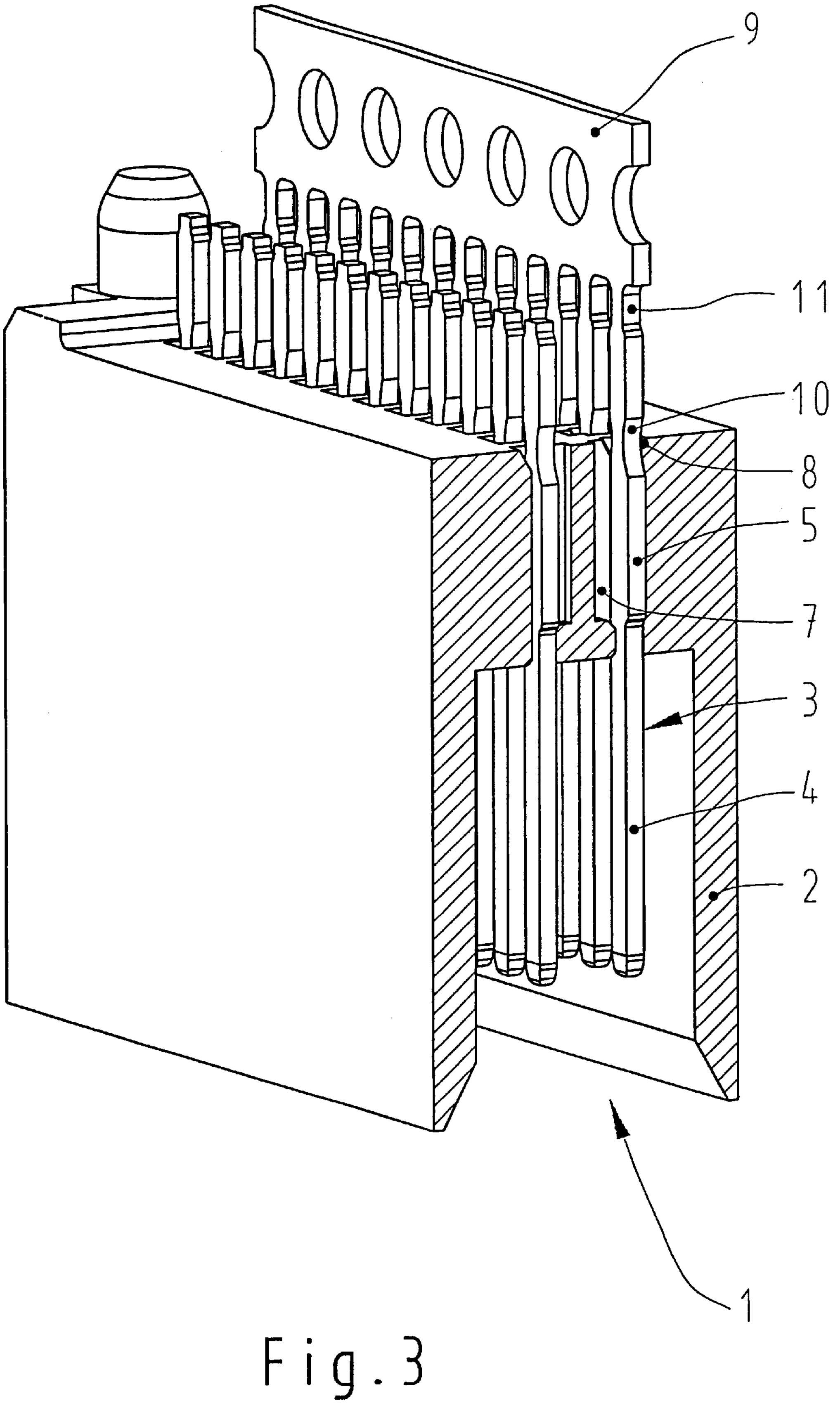
FIG. 3 shows a sectional representation, in perspective, of the plug-type connector with straight soldering-connection ends and a contact-carrier strip.

FIG. 3 shows a plug-type connector 1, in whose insulating casing 2 the operation of introducing a section with contact elements 3 belonging to the contact strip 9 has already been carried out, and also shows a row of contact elements which has already been positioned and whose contact-carrier strip 9 has already been severed. Under these circumstances, the contact elements 3 are fixed in their final position with the completion of the plugging-in operation, through the fact that they are introduced or pressed, with the fixing region 5, which is of broadened design, into correspondingly adapted receiving apertures 7 in the insulating body 2. After that, the contact-carrier strip 9 is severed in the severing region 11 by means of a device, of which no further description is given here. Under these circumstances, the clearances 10 in the contact elements 3 are disposed precisely at an edge 8 on the insulating body, which edge is formed by the end of the receiving aperture 7 with the base of the insulating body 2.

Figure 4:
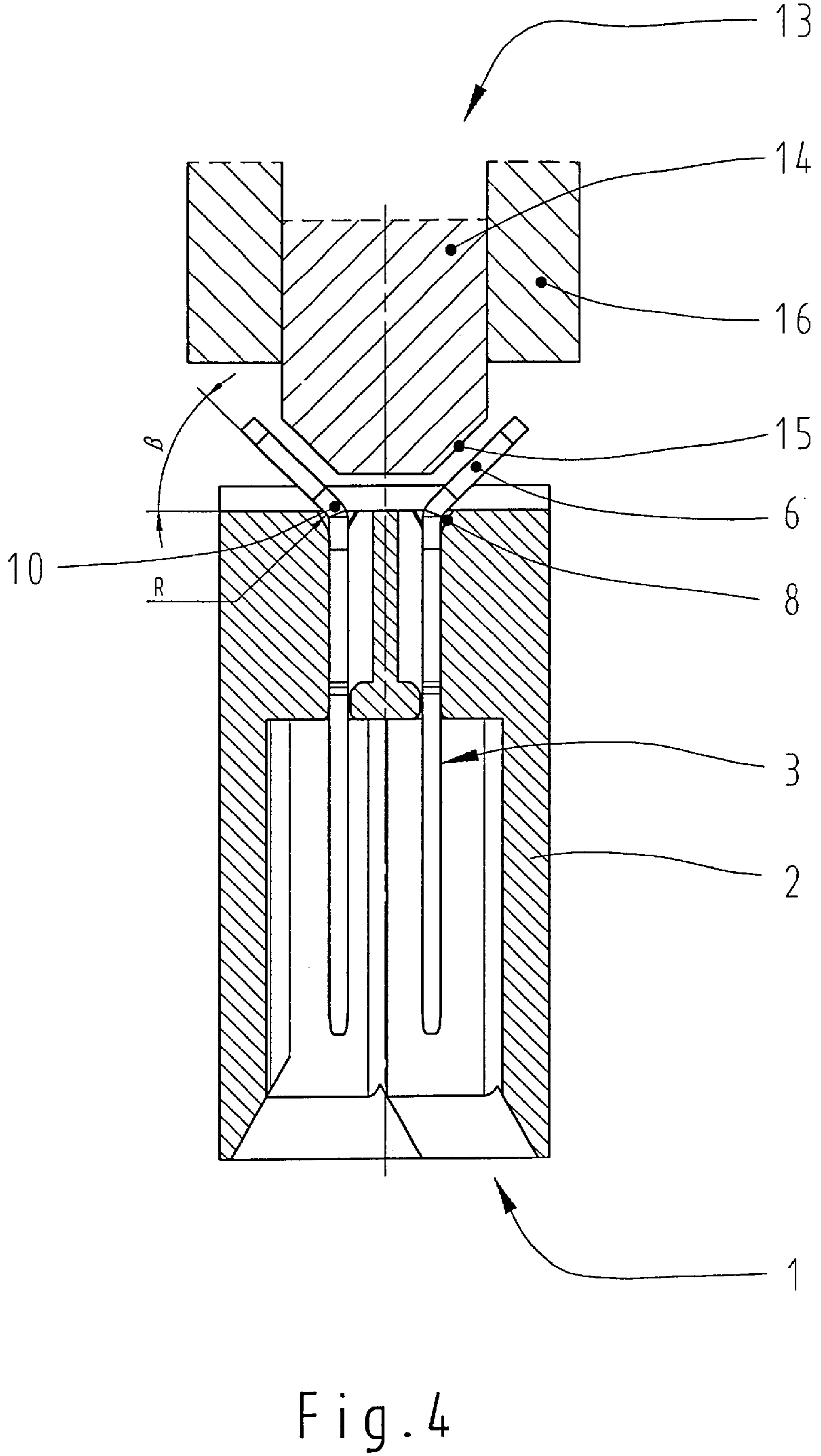
FIG. 4 shows a sectional representation of the plug-type connector with slightly angled soldering-connection ends.

FIG. 4 shows the free angling of the contact elements 3 fixed in the insulating body 2, in the course of which angling operation the soldering-connection ends 6 are bent over, in the region of the clearances 10 on the two sides, by a two-part tool 13. And this takes place, in each case, at a side face which is not provided with one of the clearances 10 on the two sides. In the process, the soldering-connection ends 6, which initially stand perpendicularly, are angled around the edge 8 to an angle β with the aid of a first tool 14 which has oblique faces 15. In this process, the bending stress is compressed in the smallest cross-section of the constricted region of the clearances 10 in the contact element 3, so that the soldering-connection ends 6 are angled only in this region. Because of the resulting cold work-hardening in the constricted portion, a bending radius R comes about which depends on the design or contour of the clearances 10.

Figure 5:
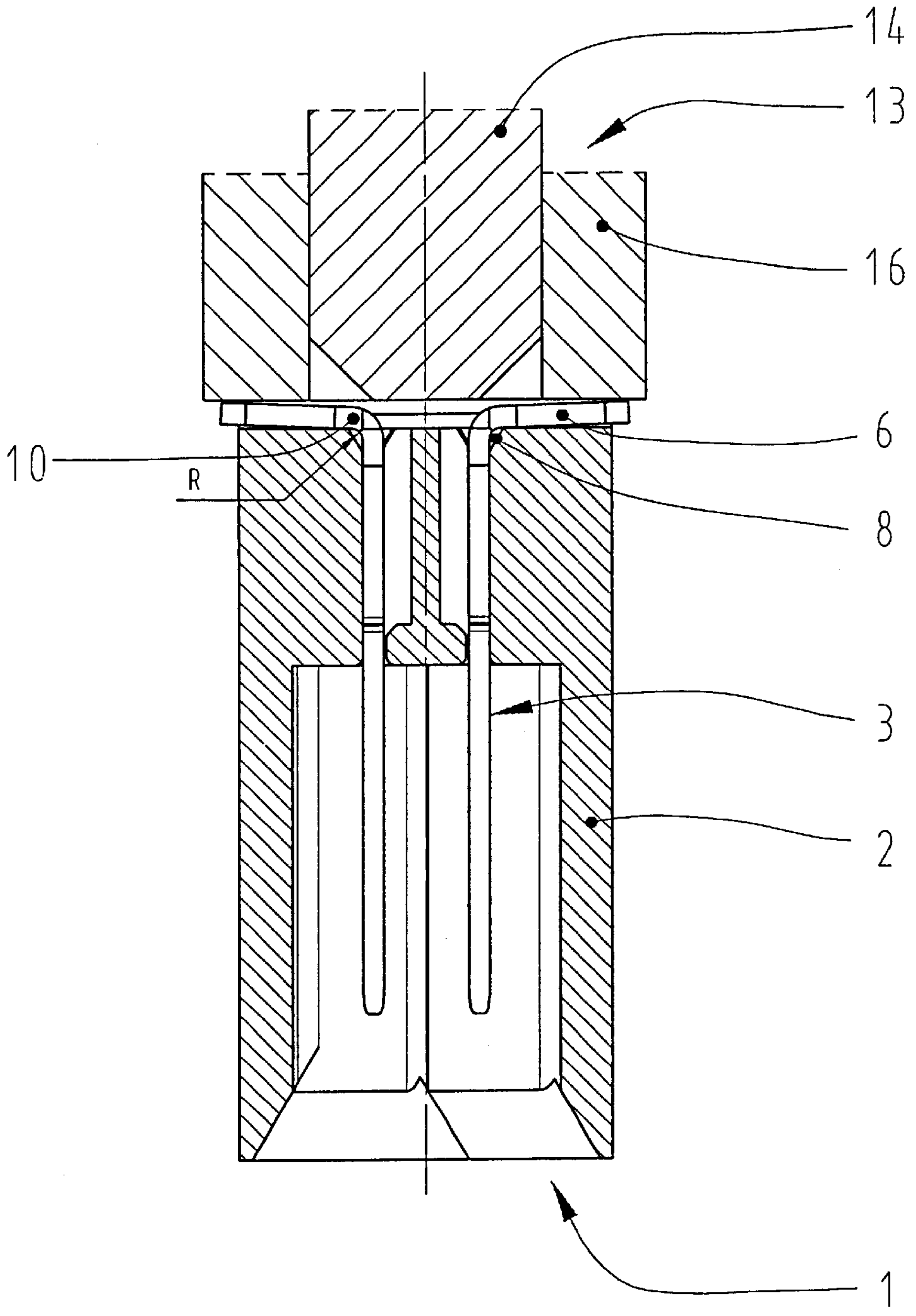
FIG. 5 shows a sectional representation of the plug-type connector with aligned soldering-connection ends.

FIG. 5 represents the way in which, with a further bending operation, the soldering-connection ends 6, which are initially still held by the tool 14, are angled to an angle of almost 90° as a result of the lowering of the second tool 16, all the soldering-connection ends being aligned at the same time in a precise and coplanar manner. Under these circumstances, it is appropriate to also incorporate into the production process the resilient recovery force after the deflection of the soldering-connection ends, so that the angle of the said soldering-connection ends does not amount to exactly 90° but to some-what less than 90°.

What is thereby achieved in the positioning of the plug-type connector, is a slightly resilient impingement of the soldering-connection ends on the soldering pads of a circuit board, and thus a somewhat increased tolerance with respect to coplanarity—that is to say to a maximally admissible band of distances between the soldering-connection ends and the circuit board.

What is claimed is:

1. A plug-type connector (1) with contact elements (3) which are disposed in an insulating body (2) and are provided with a plug-in contact end (4) and a soldering-connection end (6), the soldering-connection end being constructed for surface mounting on a circuit board, characterised in that the contact elements (3) have, between the plug-in contact end (4) and the soldering-connection end (6), opposed clearances (10) forming a constricted portion, and that the contact elements (3) are deflected, in the portion of the clearances (10), on a transverse side which is not provided with a clearance.

2. A method of manufacturing a plug-type connector according to claim 1, characterised in that the contact elements (3) which are connected together on a contact carrier strip (9) are pushed into receiving apertures (7) in the insulating body (2), and are fixed in the receiving apertures (7), the clearances (10) in the contact elements (3) being positioned at an edge (8) at the bottom of the insulating body (2), that the contact elements (3) are severed from the contact-carrier strip (9), that the soldering-connection ends (6) of the contact elements (3) which protrude perpendicularly out of the insulating body are acted on by a first tool (14), the soldering-connection ends (6) being initially bent over, transversely to the clearances (10), to an angle of< 90° to the perpendicular, and that the soldering-connection ends (6) are then acted on by a second tool (16), the soldering-connection ends (6) being bent to an angle of almost 90° to the perpendicular.

* * * * *